(12) United States Patent
Lan

(10) Patent No.: US 10,707,680 B2
(45) Date of Patent: Jul. 7, 2020

(54) ELECTRIC MOTOR SYSTEM AND HIGH-FREQUENCY HARMONIC SUPPRESSING DEVICE OF THE SAME

(71) Applicant: Kong Ming Motor Co., Ltd., Dongshi Dist., Taichung (TW)

(72) Inventor: Ching-Chuan Lan, Taichung (TW)

(73) Assignee: KONG MING MOTOR CO., LTD., Taichung (TW)

( * ) Notice: Subject to any disclaimer, the term of this patent is extended or adjusted under 35 U.S.C. 154(b) by 175 days.

(21) Appl. No.: 16/124,912

(22) Filed: Sep. 7, 2018

(65) Prior Publication Data
US 2020/0006939 A1    Jan. 2, 2020

(30) Foreign Application Priority Data

Jul. 2, 2018 (TW) .............................. 107208952 A

(51) Int. Cl.
| | |
|---|---|
| *H02J 3/01* | (2006.01) |
| *H02M 1/12* | (2006.01) |
| *H02K 11/028* | (2016.01) |
| *H02J 1/02* | (2006.01) |
| *H02J 3/38* | (2006.01) |
| *H03H 7/01* | (2006.01) |
| *H02P 27/04* | (2016.01) |
| *H03H 7/09* | (2006.01) |
| *H02M 1/084* | (2006.01) |

(52) U.S. Cl.
CPC ................. *H02J 3/01* (2013.01); *H02J 1/02* (2013.01); *H02J 3/38* (2013.01); *H02K 11/028* (2013.01); *H02M 1/084* (2013.01); *H02M 1/126* (2013.01); *H02P 27/04* (2013.01); *H03H 7/09* (2013.01); *H03H 7/1758* (2013.01)

(58) Field of Classification Search
None
See application file for complete search history.

(56) References Cited

U.S. PATENT DOCUMENTS

| | | | | |
|---|---|---|---|---|
| 2004/0264089 | A1* | 12/2004 | Furuya ...................... | H02J 3/38 361/92 |
| 2015/0263508 | A1* | 9/2015 | Zhu ......................... | F03D 17/00 290/44 |
| 2016/0197573 | A1* | 7/2016 | Iwata ....................... | H02P 6/10 318/400.26 |

* cited by examiner

*Primary Examiner* — Jared Fureman
*Assistant Examiner* — Aqeel H Bukhari
(74) *Attorney, Agent, or Firm* — Muncy, Geissler, Olds & Lowe, P.C.

(57) ABSTRACT

The electric motor system of the present invention includes an electric motor and a driving device. The electric motor includes a grounded housing, and multi-phase stator windings and a neutral point, which are disposed in the housing and form a star connection. The driving device is connected with the multi-phase stator windings and includes a rectifying circuit, a voltage stabilizing capacitor and a high-frequency driving circuit. The voltage stabilizing capacitor is connected with an output end of the rectifying circuit to provide a direct-current power source to a direct-current power source circuit. The high-frequency driving circuit is connected with the direct-current power source circuit and the multi-phase stator windings, and generates multi-phase driving signals to drive the multi-phase stator windings. A high-frequency harmonic suppressing device is connected with the neutral point and the direct-current power source circuit.

13 Claims, 5 Drawing Sheets

ELECTRIC MOTOR SYSTEM AND HIGH-FREQUENCY HARMONIC SUPPRESSING DEVICE OF THE SAME

BACKGROUND OF THE INVENTION

1. Field of the Invention

The present invention relates to electric motors and more particularly, to an electric motor system and a high-frequency harmonic suppressing device of the same.

2. Description of the Related Art

Presently, in the driving device for the direct-current brushless electric motor, the alternating current is rectified through a rectifier and then provided as a stable voltage source through a voltage stabilizing capacitor to cause a high-frequency switching module to drive the electric motor. The voltage stabilizing capacitor is usually used for providing stable voltage and unable to filter out the high-frequency harmonic of the electric motor.

The high-frequency switching of the inverter of the driving device and the stray capacitance effect existing in the electric motor cause the windings in the electric motor to produce high-frequency leakage current. When the high-frequency leakage current enters the direct-current power source circuit, the high-frequency harmonic, such as high-frequency electromagnetic interference (EMI), occurs to increase the heat loss of the electric motor and deteriorate the performance of the electric motor.

The voltage stabilizing capacitor can handle only the low-frequency harmonic, wherein the low frequency is several times of the frequency of the supply mains. For example, the frequency of the supply mains may be 50 Hz or 60 Hz. The voltage stabilizing capacitor is unable to effectively filter out the high-frequency harmonic whose frequency is at least thousands of hertz (KHz), so that the high-frequency operated electric motor is poor in performance thereof.

Besides, the electric motor system, which includes a direct-current brushless electric motor or other kinds of electric motors, should be provided with a standard power source grounding point or power source grounding wire. The following two tests are performed to the direct-current brushless electric motor having star-connected stator windings. One of the tests is performed in a way that the direct-current brushless electric motor is connected with the driving device but the housing of the direct-current brushless electric motor is not grounded. During the operation of the direct-current brushless electric motor, the signal received by the driving device is detected through an oscilloscope and the resulting waveform is as shown in FIG. 7, which shows that the signal received by the driving device is not interfered by noise. The other test is performed in a way that the direct-current brushless electric motor is connected with the driving device and the housing of the direct-current brushless electric motor is grounded through a grounding wire. During the operation of the direct-current brushless electric motor, the waveform obtained by detecting the driving device through the oscilloscope is as shown in FIG. 8, which shows that the signal received by the driving device is obviously interfered by the noise of the direct-current brushless electric motor and the driving device, thereby forming sine waves with interference. Especially at partial positions of the time dimension (X-dimension), the peak value of the signal is obviously higher or lower than the sine waves. It can be known from FIG. 8 that the high-frequency harmonic of the electric motor interferes the driving device through the grounding wire, thereby affecting the signal received by the driving device. Therefore, how to effectively segregate or absorb the high-frequency harmonic of the electric motor is a serious problem needing a solution.

SUMMARY OF THE INVENTION

The present invention has been accomplished in view of the above-noted circumstances. It is an objective of the present invention to provide an electric motor system and a high-frequency harmonic suppressing device of the same to effectively filter out the high-frequency harmonic produced by the windings of the electric motor, wherein the electric motor is unlimited to the direct-current brushless electric motor.

To attain the above objective, the electric motor system of the present invention includes an electric motor and a driving device. The electric motor includes a housing, and multi-phase stator windings and a neutral point, which are disposed in the housing and form a star connection. The housing is grounded through a grounding wire. The driving device is connected with the multi-phase stator windings and includes a rectifying circuit, a voltage stabilizing capacitor and a high-frequency driving circuit. The voltage stabilizing capacitor is connected with an output end of the rectifying circuit and adapted to provide a direct-current power source to a direct-current power source circuit. The high-frequency driving circuit is connected with the direct-current power source circuit and the multi-phase stator windings, and generates multi-phase driving signals to drive the multi-phase stator windings. A high-frequency harmonic suppressing device is connected with the neutral point and the direct-current power source circuit.

To attain the above objective, the high-frequency harmonic suppressing device of the present invention is connected with a neutral point of a multi-phase stator winding electric motor and a direct-current power source circuit of a driving device, and the multi-phase stator winding electric motor is grounded.

Through the high-frequency harmonic suppressing device being connected with the neutral point and the direct-current power source circuit, the present invention can effectively filter out the high-frequency harmonic produced by the windings of the electric motor and stop the high-frequency harmonic to enter the direct-current power source circuit.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DETAILED DESCRIPTION OF THE INVENTION

Figure 1:
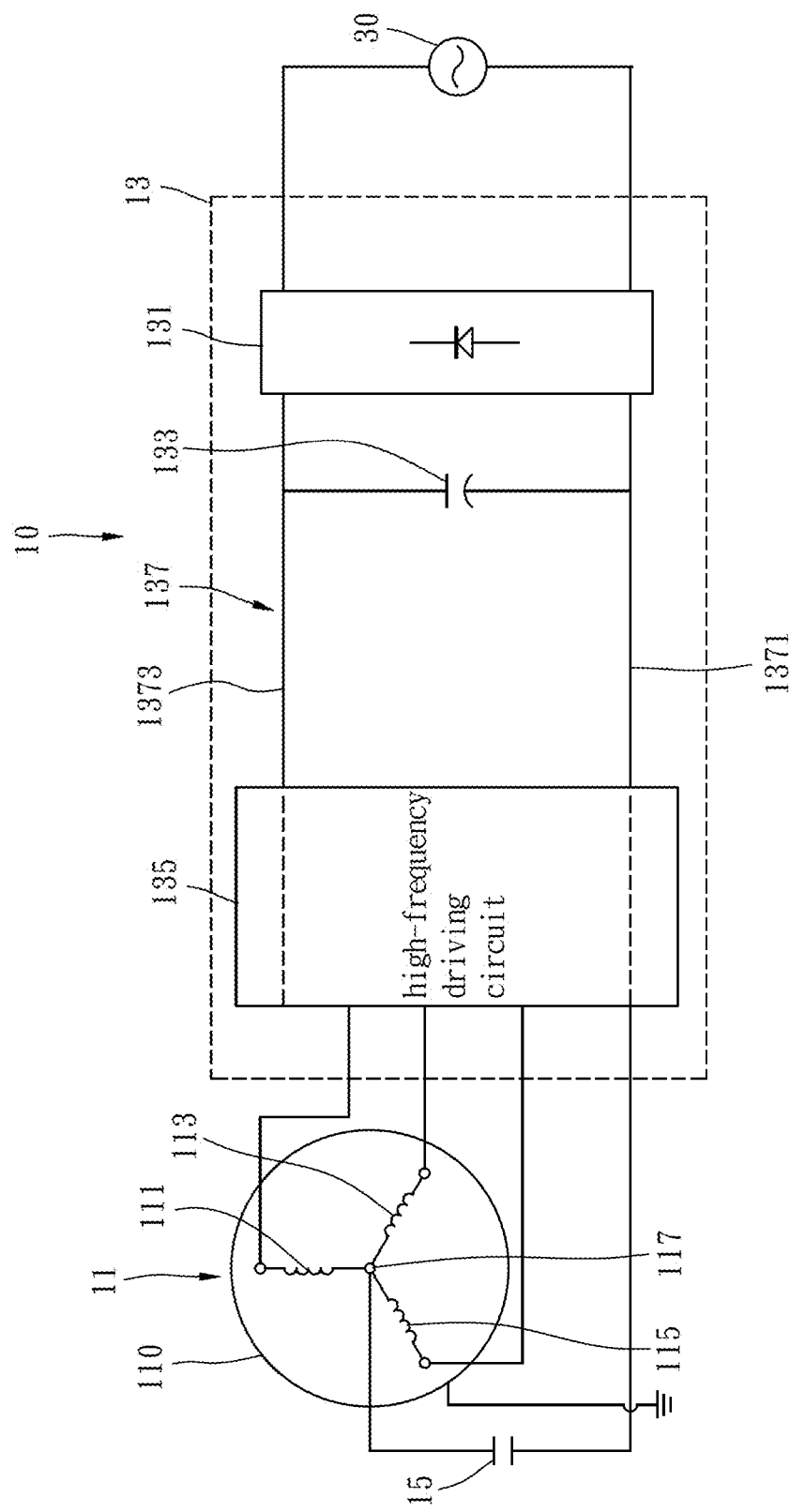
FIG. 1 is a schematic view of an electric motor system according to a first embodiment of the present invention.

In the following contents, the accompanying drawings and the associated preferred embodiments are illustrated for the description of the constitutive components and the effects of the electric motor system and the high-frequency harmonic suppressing device thereof of the present invention. However, the components, size and appearance of the electric motor system and the high-frequency harmonic suppressing device thereof shown in the figures are given only for the illustration of the technical features of the present invention, not limitative of the present invention.

The electric motor system 10 of the present invention includes an electric motor 11, a driving device 13, and a high-frequency harmonic suppressing device 15. The electric motor 11 includes a housing 110, and star-connected three-phase stator windings 111, 113, 115 and a neutral point 117 disposed in the housing 110. The housing 110 is grounded through a grounding wire, as shown in the figures. The three-phase stator windings 111, 113, 115 form a star connection, which is also known as Y-connection. In other embodiments, the amount of the phases of the stator windings 111, 113, 115 may be relatively more or less. Therefore, the stator windings are unlimited to the three-phase stator windings. Those skilled in this field should understand the electric motor 11 still includes rotor windings and other components, that will not be redundantly mentioned hereunder.

The driving device 13 is connected with the three-phase stator windings 111, 113 and 115 of the electric motor 11 and includes a rectifying circuit 131, a voltage stabilizing capacitor 133 and a high-frequency driving circuit 135. The rectifying circuit 131 is adapted to rectify an alternating-current power source 30 into a direct-current power source. The voltage stabilizing capacitor 133 is connected with the rectifying circuit 131 to provide a direct-current power source to a direct-current power source circuit 137, wherein the direct-current power source outputted through the voltage stabilizing capacitor 133 is more stable than the direct-current power source outputted through the rectifying circuit 131. The rectifying circuit 131 is well-known in the power source field and will not be redundantly mentioned hereunder. The amount of the voltage stabilizing capacitor 133 may be relatively more, unlimited to that shown in the figures.

The high-frequency driving circuit 135 is connected with the direct-current power source circuit 137 and the three-phase stator windings 111, 113 and 115. The high-frequency driving circuit 135 receives the direct-current power source to provide the direct-current power source to an electric switch of the high-frequency driving circuit 135, such as a transistor which is not shown in the figures. The electric switch of the high-frequency driving circuit 135 can be controlled to perform a switching function to generate three-phase driving signals, which is a well-known technique in the industry and therefore will not be redundantly mentioned hereunder. The three-phase driving signals drive the three-phase stator windings 111, 113 and 115 to drive the electric motor 11 to operate.

The high-frequency harmonic suppressing device 15 is connected with the neutral point 117 of the three-phase stator windings 111, 113 and 115 and the direct-current power source circuit 137 to filter out the high-frequency harmonic produced by the electric motor 11. The high-frequency harmonic suppressing device 15 can be disposed in the electric motor 11 or on the driving device 13. The high-frequency harmonic suppressing device 15 is preferably disposed on the driving device 13 and connected with the neutral point 117 through an inductive wire. If being disposed in the electric motor 11, the high-frequency harmonic suppressing device 15 preferably uses heat-resistant electronic components.

In this embodiment, the high-frequency harmonic suppressing device 15 is connected with the neutral point 117 and a low-voltage end 1371 of the direct-current power source circuit 137 to filter out the high-frequency harmonic produced by the three-phase stator windings 111, 113 and 115 of the electric motor 11. The high-frequency harmonic suppressing device 15 is a capacitor. Besides, the direct-current power source circuit 137 further has a high-voltage end 1373.

Figure 2:
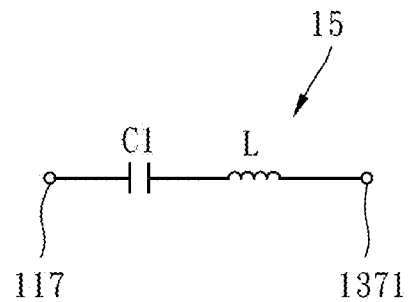
FIGS. 2-3 are circuit diagrams respectively showing other embodiments of a high-frequency harmonic suppressing device in FIG. 1.
Figure 3:
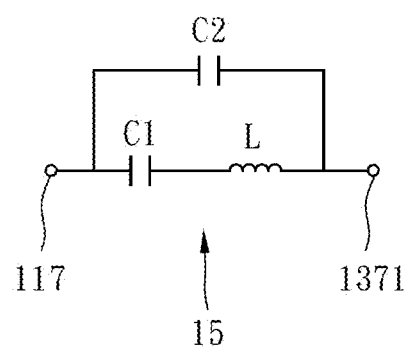

In other embodiments, the high-frequency harmonic suppressing device 15 includes a capacitor C1 and an inductor L connected in series with each other as shown in FIG. 2, or further includes another capacitor C2 connected in parallel to the capacitor C1 and the inductor L connected in series with each other as shown in FIG. 3. Besides, the amounts of the capacitor and the inductor may be relatively more. Therefore, the amounts and arrangement of the capacitor and the inductor of the high-frequency harmonic suppressing device 15 are unlimited to that in the above description.

Figure 4:
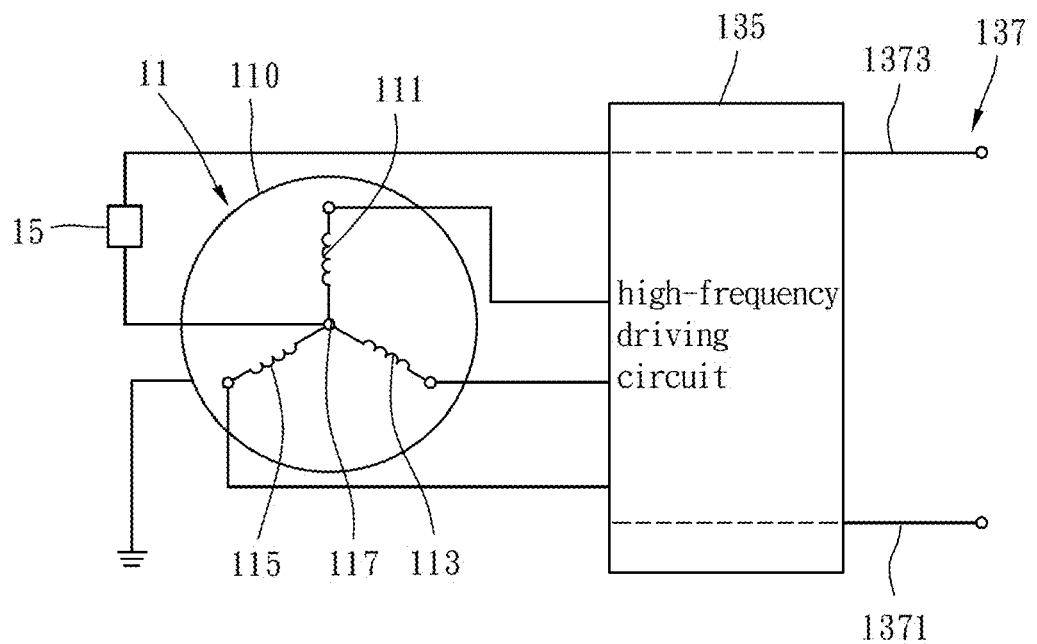
FIG. 4 is a schematic view approximately showing an electric motor system according to a second embodiment of the present invention, but not showing an alternating current power source, a rectifier and a voltage stabilizing capacitor.

The constitution of the electric motor system 10 of the present invention as shown in FIG. 4 is approximately the same with that in the aforesaid embodiment, and the identities thereof will not be repeatedly mentioned hereunder. The difference therebetween is that the high-frequency harmonic suppressing device 15 is connected with the neutral point 117 and the high-voltage end 1373 of the direct-current power source circuit 137 to filter out the high-frequency harmonic produced by the windings of the electric motor 11. The constitution and modification of the high-frequency harmonic suppressing device 15 is the same with that in the aforesaid embodiment and therefore will not be repeatedly mentioned hereunder.

Figure 5:
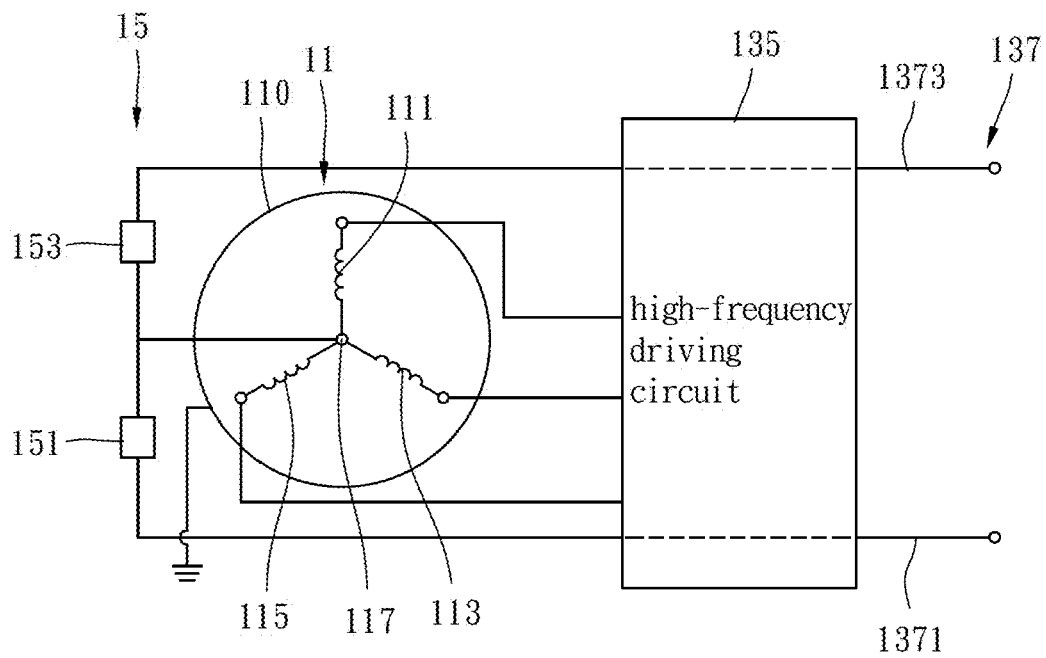
FIG. 5 is a schematic view approximately showing an electric motor system according to a third embodiment of the present invention, but not showing an alternating current power source, a rectifier and a voltage stabilizing capacitor.

The constitution of the electric motor system of the present invention as shown in FIG. 5 is approximately the same with that in the aforesaid embodiment, and the identities thereof will not be repeatedly mentioned hereunder. The difference therebetween is that the high-frequency harmonic suppressing device 15 is connected with the neutral point 117, and the low-voltage end 1371 and the high-voltage end 1373 of the direct-current power source circuit 137 to filter out the high-frequency harmonic produced by the windings of the electric motor 11.

The high-frequency harmonic suppressing device 15 includes a first filtering circuit 151 and a second filtering circuit 153. The first filtering circuit 151 is connected with the neutral point 117 and the low-voltage end 1371 of the direct-current power source circuit 137. The second filtering circuit 153 is connected with the neutral point 117 and the high-voltage end 1373 of the direct-current power source circuit 137.

In this embodiment, the first filtering circuit 151 and the second filtering circuit 153 are the same in constitution thereof. The constitution and modification of the first filtering circuit 151 or the second filtering circuit 153 is the same with that of the high-frequency harmonic suppressing device in the aforesaid embodiment. For example, each of the first filtering circuit 151 and the second filtering circuit 153 includes a capacitor, or each of the first filtering circuit 151 and the second filtering circuit 153 includes a capacitor and an inductor connected in series with each other such as that shown in FIG. 2, or each of the first filtering circuit 151 and the second filtering circuit 153 includes a capacitor and an inductor connected in series with each other and another capacitor connected in parallel to the capacitor and the inductor connected in series with each other such as that shown in FIG. 3. However, in other embodiments, the first filtering circuit 151 and the second filtering circuit 153 may be different in constitution thereof, or the same in constitution thereof but use different parameters, such as different capacitance or inductance of equivalent circuits.

Figure 6:
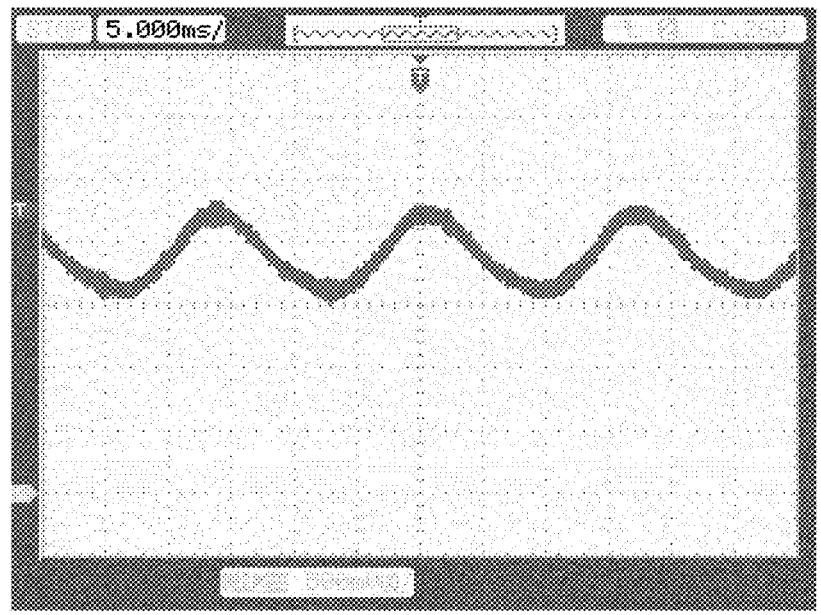
FIG. 6 is an oscillograph obtained by detecting the signal received by a driving device through an oscilloscope when the electric motor of the electric motor system of the present invention is operated in a way that the electric motor of the electric motor system of the present invention is connected with the driving device and the high-frequency harmonic suppressing device and the housing of the electric motor is grounded through a grounding wire.
Figure 7:
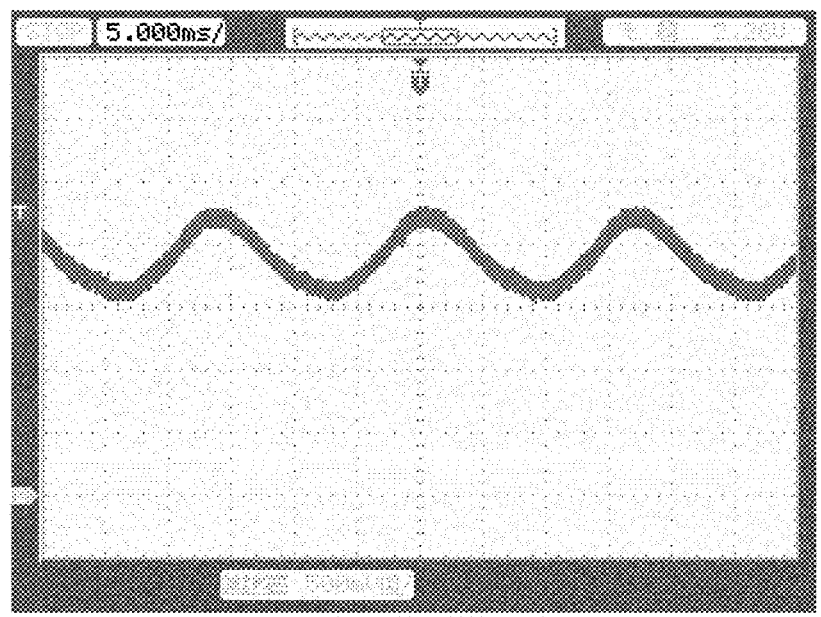
FIG. 7 is an oscillograph obtained by detecting the signal received by the driving device through the oscilloscope when the electric motor is operated in a way that the electric motor is connected with the driving device but the housing of the electric motor is not grounded.
Figure 8:
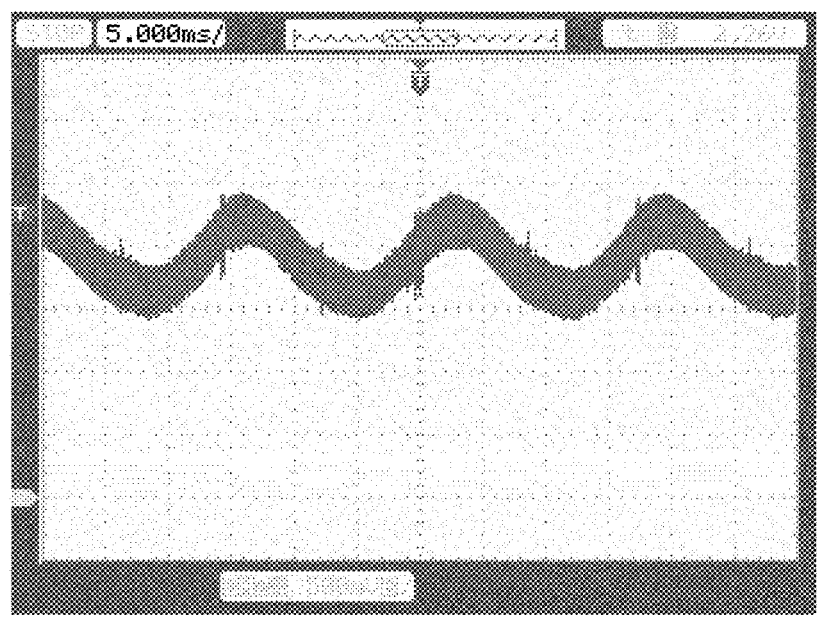
FIG. 8 is an oscillograph obtained by detecting the signal received by the driving device through the oscilloscope when the electric motor is operated in a way that the electric motor is connected with the driving device and the housing of the electric motor is grounded through a grounding wire.

FIG. 6 is an oscillograph obtained by detecting the signal received by the electric motor system 10 of the present invention through an oscilloscope when the electric motor of the electric motor system of the present invention is operated. It can be known from the above description that the electric motor system of the present invention is operated in a way that the electric motor is connected with the driving device and the high-frequency harmonic suppressing device and the housing of the electric motor is grounded through the grounding wire. It can be observed from the oscillograph of the received signal that through the high-frequency harmonic suppressing device of the present invention, the high-frequency noise of the electric motor can be effectively filtered out, so that the signal received by the driving device is prevented from being interfered by the high-frequency noise.

As a result, the electric motor system of the present invention can effectively filter out the high-frequency harmonic produced by the stator windings of the electric motor through the high-frequency harmonic suppressing device, thereby optimizing the performance of the electric motor.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. An electric motor system comprising:
   an electric motor comprising a housing, and multi-phase stator windings and a neutral point, which are disposed in the housing and form a star connection, the housing being grounded through a grounding wire;
   a driving device connected with the multi-phase stator windings and comprising a rectifying circuit, a voltage stabilizing capacitor and a high-frequency driving circuit, the voltage stabilizing capacitor being connected with an output end of the rectifying circuit and adapted to provide a direct-current power source to a direct-current power source circuit, the high-frequency driving circuit being connected with the direct-current power source circuit and the multi-phase stator windings and generating multi-phase driving signals to drive the multi-phase stator windings; and
   a high-frequency harmonic suppressing device connected with the neutral point and the direct-current power source circuit.

2. The electric motor system as claimed in claim 1, wherein the high-frequency harmonic suppressing device is connected with the neutral point and a low-voltage end of the direct-current power source circuit.

3. The electric motor system as claimed in claim 2, wherein the high-frequency harmonic suppressing device comprises a capacitor.

4. The electric motor system as claimed in claim 3, wherein the high-frequency harmonic suppressing device comprises a first capacitor, a second capacitor and an inductor; the first capacitor is connected in series with the inductor; the second capacitor is connected in parallel to the first capacitor and the inductor connected in series with each other.

5. The electric motor system as claimed in claim 2, wherein the high-frequency harmonic suppressing device comprises a capacitor and an inductor connected in series with each other.

6. The electric motor system as claimed in claim 2, wherein the high-frequency harmonic suppressing device comprises a first capacitor, a second capacitor and an inductor; the first capacitor is connected in series with the inductor; the second capacitor is connected in parallel to the first capacitor and the inductor connected in series with each other.

7. The electric motor system as claimed in claim 1, wherein the high-frequency harmonic suppressing device is connected with the neutral point and a high-voltage end of the direct-current power source circuit.

8. The electric motor system as claimed in claim 7, wherein the high-frequency harmonic suppressing device comprises a capacitor.

9. The electric motor system as claimed in claim 7, wherein the high-frequency harmonic suppressing device comprises a capacitor and an inductor connected in series with each other.

10. The electric motor system as claimed in claim 1, wherein the high-frequency harmonic suppressing device comprises a first filtering circuit and a second filtering circuit; the first filtering circuit is connected with the neutral point and a low-voltage end of the direct-current power source circuit; the second filtering circuit is connected with the neutral point and a high-voltage end of the direct-current power source circuit.

11. The electric motor system as claimed in claim 10, wherein each of the first filtering circuit and the second filtering circuit comprises a first capacitor.

12. The electric motor system as claimed in claim 11, wherein each of the first filtering circuit and the second filtering circuit comprises an inductor connected in series with the first capacitor.

13. The electric motor system as claimed in claim 12, wherein each of the first filtering circuit and the second filtering circuit comprises a second capacitor; the second capacitor of the first filtering circuit is connected in parallel to the first capacitor of the first filtering circuit and the inductor of the first filtering circuit connected in series with each other; the second capacitor of the second filtering circuit is connected in parallel to the first capacitor of the second filtering circuit and the inductor of the second filtering circuit connected in series with each other.

\* \* \* \* \*